United States Patent
Grodzki et al.

(10) Patent No.: US 9,684,048 B2
(45) Date of Patent: Jun. 20, 2017

(54) OPTIMIZATION OF A PULSE SEQUENCE FOR A MAGNETIC RESONANCE SYSTEM

(71) Applicants: David Grodzki, Erlangen (DE); Bjoern Heismann, Erlangen (DE)

(72) Inventors: David Grodzki, Erlangen (DE); Bjoern Heismann, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 643 days.

(21) Appl. No.: 14/182,512

(22) Filed: Feb. 18, 2014

(65) Prior Publication Data

US 2014/0232396 A1    Aug. 21, 2014

(30) Foreign Application Priority Data

Feb. 18, 2013    (DE) .................. 10 2013 202 559

(51) Int. Cl.
  *G01R 33/54*    (2006.01)
  *G01R 33/565*    (2006.01)

(52) U.S. Cl.
  CPC ...... *G01R 33/543* (2013.01); *G01R 33/56509* (2013.01)

(58) Field of Classification Search
  CPC .................. G01R 33/543; G01R 33/56509
  See application file for complete search history.

(56) References Cited

U.S. PATENT DOCUMENTS

| 5,512,825 | A | * | 4/1996 | Atalar | ................ | G01R 33/4833 324/303 |
|---|---|---|---|---|---|---|
| 8,030,920 | B2 | | 10/2011 | Vu et al. | | |
| 2003/0042905 | A1 | | 3/2003 | Miyazaki et al. | | |
| 2008/0024129 | A1 | | 1/2008 | Heid | | |
| 2010/0052678 | A1 | | 3/2010 | Heid et al. | | |
| 2011/0241680 | A1 | | 10/2011 | Mossnang et al. | | |
| 2013/0249548 | A1 | | 9/2013 | Stemmer | | |
| 2013/0249549 | A1 | | 9/2013 | Pfeuffer et al. | | |
| 2014/0232397 | A1 | * | 8/2014 | Grodzki | ............ | G01R 33/4824 324/309 |
| 2015/0108981 | A1 | * | 4/2015 | Grodzki | ............. | G01R 33/3671 324/318 |
| 2015/0160317 | A1 | * | 6/2015 | Grodzki | ............... | G01R 33/543 702/57 |
| 2015/0241536 | A1 | * | 8/2015 | Grodzki | ............... | G01R 33/543 324/309 |

FOREIGN PATENT DOCUMENTS

| CN | 1131906 A | 9/1996 |
|---|---|---|
| WO | WO-95/34242 A1 | 12/1995 |
| WO | 2009/034115 A1 | 3/2009 |

* cited by examiner

*Primary Examiner* — G. M. Hyder

(74) *Attorney, Agent, or Firm* — Schiff Hardin LLP

(57) ABSTRACT

In a method and a pulse sequence optimization device to determine a pulse sequence for a magnetic resonance system, a pulse sequence is selected for optimization that includes a number of radio-frequency pulses and a number of gradient pulses chronologically coordinated therewith. An automatic analysis of the pulse sequence takes place to identify fixed point/time periods in the pulse sequence that are to be left unmodified, and modifiable time intervals in the pulse sequence that may be optimized. An automatic optimization of gradient pulses in the modifiable time intervals takes place according to a predetermined optimization criterion, while keeping the length of modifiable time intervals constant.

16 Claims, 7 Drawing Sheets

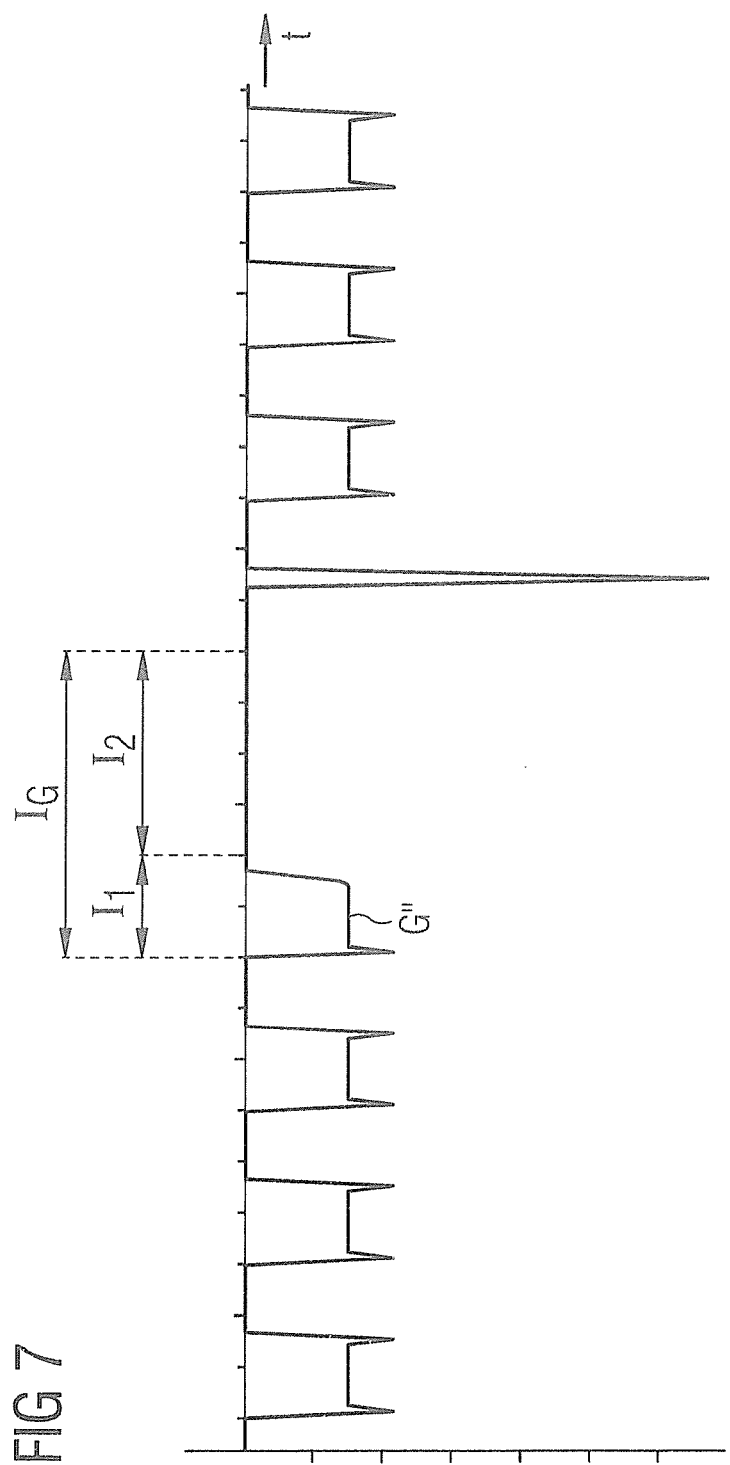

OPTIMIZATION OF A PULSE SEQUENCE FOR A MAGNETIC RESONANCE SYSTEM

BACKGROUND OF THE INVENTION

Field of the Invention

The present invention concerns a method to optimize a pulse sequence for operating a magnetic resonance system. Moreover, the invention concerns a method to operate a magnetic resonance system using such an optimized pulse sequence, as well as a pulse sequence optimization device and a magnetic resonance system designed to implement this method.

Description of the Prior Art

In a magnetic resonance system—also called a magnetic resonance tomography system—the body to be examined is typically exposed to a relatively high basic magnetic field (for example of 1, 5, 3 or 7 Tesla) with the use of a basic field magnet system. A magnetic field gradient is additionally applied by a gradient system. Via suitable antenna devices, radio-frequency excitation signals (RF signals) are then emitted from a radio-frequency transmission system, such radio-frequency excitation signals causing nuclear spins of specific atoms that have been excited to resonance by the radio-frequency field to be flipped by a defined flip angle relative to the magnetic field lines of the basic magnetic field. Upon relaxation of the nuclear spins, radio-frequency signals (magnetic resonance signals) are emitted that are received by suitable reception antennas and then processed further. The desired image data can be reconstructed from the raw data acquired in such a manner.

For a specific measurement (data acquisition), a defined pulse sequence is emitted, which includes a series of radio-frequency pulses (in particular excitation pulses and refocusing pulses) and gradient pulses emitted in coordination with the RF pulses. Readout windows, which temporally match these other pulses, must be set so as to predetermine the time periods in which the induced magnetic resonance signals are detected. The timing within the sequence—i.e. at what time intervals which pulses follow one another—is of particular significance for the imaging. Multiple control parameters are normally defined in a combination known as a measurement protocol, which is created in advance and can be retrieved from a memory (for example) for a defined measurement, and may possibly be modified by the operator on site. The operator may provide additional control parameters (for example a defined slice interval of a stack of slices to be measured, a slice thickness etc.). A pulse sequence (which is also designated as a measurement sequence) is then calculated based on all of these control parameters.

The gradient pulses are defined by their gradient amplitude, gradient pulse duration and edge steepness, namely the first derivative of the pulse shape dG/dt of the gradient pulses (typically also designated as "slew rate"). An additional important gradient pulse variable is the gradient pulse moment (also shortened to "moment"), which is defined by the integral of the amplitude over time.

During a pulse sequence, the magnetic gradient coils with which the gradient pulses are emitted are switched frequently and rapidly. Since the time requirements within a pulse sequence are usually very strict, and additionally the total duration of a pulse sequence that determines the total duration of an MRT examination must be kept as short as possible, gradient strengths around 40 mT/m and slew rates of up to 20 mT/m/ms must be achieved at least for short durations. In particular, such a high edge steepness contributes to the known noise development during the switching of the gradients. Eddy currents with other components of the magnetic resonance scanner (data acquisition unit)—in particular the radio-frequency shield—are one reason for this noise development. In addition, steep edges of the gradients lead to a higher power consumption and additionally impose greater demands on the gradient coils and the additional hardware. The rapidly changing gradient fields lead to distortions and oscillations in the gradient coils and to the transfer of these energies to the housing. In MR systems wherein the basic magnetic field is produced by a magnet having superconducting coils that are kept in a superconducting state by liquid helium, a high helium boil-off can occur due to heating of the coils and the additional components.

Particularly in order to reduce the noise exposure, various solutions have been proposed for the design of the hardware, for example casting or vacuum sealing of the gradient coils.

SUMMARY OF THE INVENTION

An object of the present invention is to provide an optimization method as well as a corresponding pulse sequence optimization device to optimize a pulse sequence, which can be realized with relatively little expenditure.

An inherently ready-to-use—i.e. emission-ready—pulse sequence that can still be optimized within the method according to the invention is used as a starting point. This pulse sequence includes a number (i.e. one or more) of radio-frequency pulses, for example at least one excitation and/or refocusing pulse as well as a number of gradient pulses that are temporally coordinated with the RF pulses. The precise parameters of the radio-frequency pulses (i.e. their temporal position and shape) are defined exactly within the pulse sequence, just as the individual gradient pulses are exactly predetermined by defined parameters such as time length, amplitude, edge steepness etc. The pulse sequence and its parameters typically pertain in a customized manner to the object (organ) for which the MR image is to be produced.

An automatic analysis of the pulse sequence additionally takes place in order to identify the fixed point/time periods in the pulse sequence that are to be left unmodified, and in order to identify time intervals in the pulse sequence that may be optimized. As used herein, fixed point/time periods are individual points in time or time intervals at which the current values of the gradients must be unmodifiably fixed so that the gradients can continue to fulfill their proper function. For example, among these are slice-selection gradients or gradients during the readout times that serve to achieve a defined coding at a defined point in time. Additional examples are provided below. Situated between these unmodifiable individual points or time periods at which a defined gradient must have a very definite value, are modifiable time intervals in which gradient pulses are wholly or partially activated that, although they also satisfy a defined function, do not depend on time specifications being precisely complied with and/or that a specific amplitude is present at a very exact point in time, for example. In these modifiable time intervals, it is often sufficient for a predetermined amplitude being achieved up to a specific point in time, or for at least one defined moment to be achieved within a broader time range. In these time intervals, the gradient pulse shapes can in principle be varied under adherence to specific boundary conditions, such that these time intervals are provided for an optimization.

In a further step, the automatic optimization of gradient pulses then takes place in the modifiable time intervals according to a predetermined optimization criterion.

In principle, an arbitrary optimization criterion can be predetermined.

For example, in a variant within the scope of the invention, an optimization can take place so as to cause the coding by the gradient pulses to take place as quickly as possible, such as in order to minimize flow artifacts due to moving substances (blood flow, for example).

In a preferred variant, an optimization for noise reduction takes place. The first derivative of the pulse shape of the gradient pulses preferably is optimized automatically for this purpose in the modifiable time intervals. This means that the gradient curve, for example, is optimized in the modifiable time intervals, so that an optimally low slew rate is maintained under defined boundary conditions since this leads to particularly high levels of noise. In other words: the optimization step with regard to an optimally high level of noise reduction takes place by optimizing the pulse shape by minimization of the first derivative of the function that predetermines the pulse shape. Amplitudes of the gradients can also be minimized. Since an optimization for noise reduction by an optimization of the first derivative of the pulse shape is presumably the most common case, in the following this variant is most often assumed as an example. However, the method should not be limited by these examples to this optimization criterion insofar as there is not an explicit statement otherwise.

The gradient pulse shapes and/or the gradient curve are/is then preferably smoothed in the optimization since a particularly good noise reduction is achieved in this way.

Independently of the optimization criterion that is used, the optimization preferably takes place while keeping the time length of the respective time intervals constant, such that the timing of the pulse sequence overall remains unaffected by the optimization.

In principle, it is also possible to provide various optimization criteria, for example also different optimization criteria for different time segments or different types of pulses.

By the method according to the invention, the entire gradient curve is optimized automatically without negatively affecting the individual pulses. The pulse shape is left at the defined value only at the important points in time or, respectively, in the important time periods of the pulse sequence which are (as described) unmodifiable relative to the current gradient amplitude. All regions between these—even spanning across pulses—are available for an optimization of the pulse shape.

The pulse shapes are respectively optimized separately in the individual gradient directions, meaning that the pulse shape or the gradient curve is considered and optimized separately in each gradient direction (for example x-, y-, z-direction or, respectively, slice selection direction, phase coding direction and readout direction).

The following advantages (among others) also result via the possibility of the pulse-spanning optimization:

For example, if an optimization with regard to the first derivative of the pulse shape takes place, a marked reduction of the slew rate that is used (and therefore a lower loading of the gradient curve) is achieved. A lower power consumption, a lower heating of the gradient coils, and therefore also a reduced helium boil-off are incurred with this. Furthermore, new possibilities to create more cost-effective gradient coils result from this. Moreover, a markedly reduced noise development during the examination is achieved.

In addition, a suitable pulse sequence optimization unit which implements the optimization can be implemented with relatively little effort in the existing sequence framework, as is shown later.

In a method according to the invention for the operation of a magnetic resonance system, according to the previously described method a pulse sequence is initially optimized and then the magnetic resonance system is operated using the optimized pulse sequence. During the measurement—i.e. when a patient lies in a patient tunnel of the system—less noise (for example) is created (given correspondingly selected optimization criterion) without losses in the image quality, and without extending the measurement duration. The optimization can advantageously be implemented online in or directly before the execution of the pulse sequence, as is explained below using examples.

A pulse sequence optimization unit designed (configured) to optimize a pulse sequence by implementing the method according to the invention requires: only one input interface to accept the pulse sequence to be optimized; an analysis unit to analyze the pulse sequence in order to identify the fixed point/time periods in the pulse sequence that are to be left unmodified, and the modifiable time intervals in the pulse sequence that may be optimized; and a pulse shape optimization unit to optimize the pulse shape of gradient pulses in the modifiable time intervals according to a predetermined optimization criterion.

In addition to a typical radio-frequency transmission system, a gradient system and a control device which is designed in order to implement a desired measurement on the basis of a predetermined pulse sequence, to control the radio-frequency transmission system and to control the gradient system, a magnetic resonance system according to the invention also has a pulse sequence optimization device according to the invention.

The pulse sequence optimization device is advantageously part of the control device of the magnetic resonance system and advantageously is upstream of (and relatively close to) the radio-frequency transmission system or, respectively, the gradient system.

At least significant portions of the pulse sequence optimization device can be designed in the form of software components, particularly the analysis unit and the pulse sequence optimization device. For example, the input interface can be an interface in order to accept data with regard to a pulse sequence from a data store via a network, or in particular within a control device of a magnetic resonance system. The interface can be designed at least partially in the form of software and can possibly access hardware interfaces of an existing computer.

The invention thus also encompasses a non-transitory, computer-readable storage medium that can be loaded directly into a memory of a pulse sequence optimization device, with program code segments in order to cause all steps of the method according to the invention to be implemented when the program is executed in the pulse sequence optimization device. Such a realization in software has the advantage that previous control devices of magnetic resonance systems can be suitably modified by implementation of the program in order to optimize pulse sequences in the manner according to the invention.

A pulse sequence in the form of chronologically sequential event blocks can advantageously be transmitted to a pulse transmission arrangement, which then (for example) directly controls the radio-frequency transmission system to emit the individual radio-frequency pulses or controls the gradient system to emit the individual gradient pulses. In the method according to the invention, the transmission of the pulse sequence to a pulse transmission arrangement also takes place in the form of such event blocks. Each event block normally characterizes a defined event (for example the emission of a fat saturation pulse); a defined spoiler gradient; a defined repetition within a gradient echo sequence, etc. The individual events under the circumstances include multiple radio-frequency pulses or switched readout windows as well as switched gradient pulses matched thereto. Switching of a readout window means the activation of a reception device for the magnetic resonance signals, for example an ADC (analog/digital converter) that is connected to the reception coils of the magnetic resonance system.

Within the scope of a preferred variant of the method, however, before the transmission to the pulse transmission arrangement every arriving event block is initially analyzed (for example in a testing module) to identify fixed point/time periods and modifiable time intervals in the respective event block. A new subdivision of the pulse sequence into outgoing event blocks then takes place depending on this analysis. This new subdivision advantageously takes place so that an event block includes either only one fixed point/time period or a modifiable time interval. In other words: the fixed point time/periods and the modifiable time intervals are relayed as separate outgoing event blocks (for example from the testing module to the pulse transmission arrangement), wherein adjoining fixed point/time periods and adjoining modifiable time intervals in adjoining incoming event blocks are particularly preferably combined into new outgoing event blocks. According to the invention, the outgoing event blocks which include a modifiable time interval are then initially subjected to the optimization step to optimize the pulse shape before they are then transmitted to the pulse transmission arrangement. The outgoing event blocks that, in contrast to this, include only a fixed point/time period are relayed without modification to the pulse transmission arrangement, possibly after a delay so that they arrive again at the pulse transmission arrangement with a matching time coordination with the outgoing event blocks that have been optimized in the meantime. This pulse transmission arrangement then executes the unoptimized event blocks and the optimized event blocks serially in the matching order, meaning that it sends the corresponding control commands to the radio-frequency transmission system and the gradient system so that the entire optimized pulse sequence is emitted in the correct chronological manner, with a timing that is unchanged relative to before the optimization.

There are various techniques that can be used to identify or analyze the time periods within the pulse sequence, in order to establish whether a time period in question is a fixed point/time period or an optimizable time interval.

A time period within a pulse sequence is preferably identified as a fixed point/time period at least when at least one of the following events should take place in the time period according to the pulse sequence:

Emit a radio-frequency pulse. If a radio-frequency pulse is emitted simultaneously with a gradient, it is to be assumed that the gradient switched at this time serves to have the radio-frequency pulse act on a defined spatial volume. A modification of the amplitude during this time period would therefore lead to an adulteration of the sequence.

Read out raw data, i.e. place a readout window or, respectively, the switching of an ADC so that it is ready to receive. Here as well, the simultaneously switched gradients serve for a coding as to in which spatial region the magnetic resonance signals are received. A modification of the gradient amplitude would also lead to an adulteration of the sequence in this time period.

Switch a flow compensation gradient pulse. This comprises two gradient moments of the same magnitude but different polarity. If this gradient pulse were to be modified, the flow compensation could be destroyed since the opposite directed moments would be combined into a zero moment in the optimization.

Switch a diffusion gradient pulse. These diffusion gradient pulses also serve to apply a defined gradient amplitude over entire defined time periods in order to thus achieve a defined coding of the signal. Here as well a modification would therefore lead to an adulteration of the measurement.

Switch a knock gradient pulse. Such knock gradient pulses (also called "tok-tok-tok pulses") serve to generate a defined knock noise that is not too loud but also not too quiet at the beginning of a measurement. The patient located in the scanner can then prepare himself or herself for the measurement that is now beginning with a (normally unavoidable) noise exposure. For example, if such knock gradient pulses were subjected to a noise optimization, this would lead to a noise reduction of the knock gradient pulses, which then no longer fulfill their function of forewarning the patient.

It is to be noted that the inherently "not modifiable" gradient pulses can also include time intervals that can be optimized, for example in the manner that the edges can be changed as long as the plateau parameters (height and length) are maintained, for example.

The identification of a time period within a pulse sequence as a fixed point/time period or as a modifiable time interval can accordingly advantageously take place via at least one of the following procedures:

Analyze the radio-frequency pulse transmission times;

Analyze the readout times;

Analyze the shape of the gradient pulses, for example in that these are compared with predetermined template pulse shapes for defined, unmodifiable gradient pulses. If a gradient pulse corresponds to this template pulse shape, this is an indication that it is such an unmodifiable gradient pulse;

Analyze identifiers (for example names, flags etc.) included in an event block parameter set that indicate that the following gradient pulse in the appertaining event block is not a gradient pulse to be modified. For example, an event block that includes a defined gradient pulse can include the individual amplitudes of points in time to be defined that are predetermined in a fixed scan raster. Alternatively, however, the parameters about a rise time; the maximum amplitude to be achieved after a defined amount of time; the duration of a plateau time in which the amplitude is kept constant; and a fall time can also be included in order to completely define the gradient pulse. Additionally, in both cases the event block or, respectively, event block parameter set can also still include information as to whether the event block includes an unmodifiable pulse or is even a coding or, respectively, designation of what type of gradient pulse it is, for example a flow compensation gradient pulse, a diffusion gradient pulse etc.

Moreover, it is also possible to define not only the aforementioned gradient pulse types as unmodified, but also to establish additional gradient pulses or gradient pulse types as unmodifiable for the specific pulse sequence as needed, for example by setting the testing module accordingly in order to identify such additional gradient pulses defined as unmodifiable, and/or by corresponding identifiers for these pulses being set in the event block parameter sets, for example.

The preferred variants cited above show that it is relatively simply identify the fixed point/time periods and then optimize the remaining time intervals. In particular, such fixed point/time periods in the gradient pulses can be differentiated relatively simply from pulses of the type known as gradient spoiler pulses.

In a number of pulse sequences that are used frequently in clinical magnetic resonance tomography (MRT)—for example spin echo sequences (SE sequences) or turbo spin echo sequences (TSE sequences)—gradient spoiler pulses ("spoilers") are executed in addition to the gradient pulses that are necessary for a spatial coding. Gradient spoiler pulses—also called gradient crusher pulses ("crushers") in some cases, particularly if they occur in pairs—are executed by the gradient coils immediately before and/or after the actual gradient pulses and ensure that unwanted free induction decay (FID) signals (for example) are suppressed.

Such spoiler or crusher gradients are the type that often lead to a high noise volume, such that it is worthwhile to optimize such pulses.

In many cases it is important for the optimized gradient pulses to have a defined moment. As explained above, the moment of a gradient pulse is normally the integral of the amplitude over time, i.e. the area under the gradient pulse. Depending on whether the gradient pulse is positive or negative, the moment can also be accordingly positive or negative. For example, the spoilers or crushers must also each have a precisely defined spoiler or crusher moment so that they suppress the FID signals with certainty.

Therefore, in the optimization of the pulse shape of a gradient pulse it is advantageously ensured that the moment of the gradient pulse is kept constant.

Furthermore, it is advantageously ensured that the gradient amplitude is kept constant at defined fixed points given the optimization of a gradient pulse. Defined fixed points within the optimizable time interval can be predetermined, for example reaching an amplitude value of zero at an especially defined point in time. However, the fixed points preferably include at least the boundary values at interval boundaries of the modifiable time interval with adjoining fixed point/time periods. For example, if a re-sorting of the event blocks takes place in outgoing event blocks that respectively include ether only a modifiable time interval or only a fixed point/time period, the boundary values are then the limit values at the start and end of the respective, optimizable outgoing event blocks. Through this boundary condition it is ensured that there are no jumps (discontinuities), and the shape of the gradient pulse is selected so that it proceeds continuously across event block boundaries, or across boundaries between fixed point/time regions and modifiable time intervals.

Moreover, care is preferably taken to ensure that the first derivative (slope) relative to the corresponding limit value of the adjoining fixed point/time period or outgoing event block is also zero at these boundary values, such that a more uniform transition without edges is achieved.

Within a modifiable time interval or optimizable event block, multiple adjoining gradient pulses are preferably merged into a common, continuous gradient pulse in the optimization. A particular advantage relative to conventional methods is that the gradient amplitude is not unnecessarily reduced to a value of zero, only to rise again with a correspondingly steep edge in order to form the next gradient pulse.

Particularly for measurement protocols with long repetition times (such as turbo spin echo measurements) or with longer pauses after pre-pulses or measurement intervals, the gradient spoiler pulses that are often placed at the end and the start of the intervals given the merging of gradient pulses can extend very far beyond the time period of the pause. It may happen that the intended spoiling is prevented, for example due to a movement of the substance that is to be examined (for example due to blood flow or a movement of the patient). In order to avoid this, a variant of the method according to the invention can be used in which it is initially checked whether the entire moment of all gradient pulses per time period is less than a predetermined limit value in an optimized time interval of a defined gradient direction. This means that a check is made as to whether the entire moment of all gradient pulses in the interval divided by the time (thus the average moment) is too small. If this is the case, a subdivision takes place into multiple time intervals, and the pulse shape is then optimized so that a gradient amplitude not equal to zero is present only in some of these partial intervals, or only in one partial interval in this direction. For example, in one of the partial intervals, the amplitude can then be deliberately set to zero, and this is then considered to be a fixed point time period. In the remaining time interval or time intervals, the gradient pulse shape is then automatically modified so that the gradient amplitude is set accordingly higher. By appropriate interval boundaries, or fixed points and boundary conditions, it can be ensured that the necessary moment is generated in the partial intervals.

In principle, different methods for optimization can be used in order to keep the first derivative of the pulse shape as small as possible and to thereby comply with the predetermined boundary conditions, in particular to achieve the given fixed points.

It has been shown to be particularly effective to use a technique known as a spline interpolation method. A method of the fourth order (power) is preferably used. In a spline interpolation, it is sought to interpolate given node points (for example the fixed points in the present case) with the use of polynomials that are continuous in parts (known as splines). Alternatively, a polynomial interpolation would also be usable. However, the spline interpolation method has the advantage that curve progressions with defined approximation properties that are still usable can be achieved at only a low cost when the fixed points are disadvantageously situated. In particular, a spline interpolation can also be calculated with little loss of linearity.

If a gradient curve $G_k(t)$ should be replaced by a smoothed gradient curve function $S(t)$ by means of a spline interpolation over a time interval $t=[0, \tau]$, the conditions described above that are to be complied with in the smoothing can be mathematically described as follows:

$$S(0) = G_1 \qquad (1)$$

$$S(\tau) = G_2 \qquad (2)$$

$$\dot{S}(0) = 0 \qquad (3)$$

-continued $$\dot{S}(\tau) = 0 \quad (4)$$

$$\int_{0_I}^{\tau} S(t')dt' = \int_{0}^{\tau} G_k(t')dt' = F \quad (5)$$

Equations (1) and (2) respectively ensure that a defined amplitude value is achieved at the boundaries of the interval, meaning that a fixed point is maintained. The conditions (3) and (4) ensure that the first derivative disappears at these fixed points (i.e. at the interval boundaries), and thus a smooth transition to the directly adjoining fixed point time periods is provided. The last condition ensures that the gradient moment F—and thus the effect on the spin phases—remains constant, as this has also been defined in the preceding.

If a spline of the fourth order is now used, this is described by the function $$S(t)=a+bt+ct^2+dt^3+et^4, \quad (6)$$

wherein it is hereby a smooth function with five parameters a, b, c, d, e. The parameters a=G1, g=0 and $$\begin{pmatrix} c \\ d \\ e \end{pmatrix} = M^{-1} \begin{pmatrix} G_2 - G_l \\ 0 \\ F - G_l\tau \end{pmatrix} \quad (7)$$

are automatically obtained from the conditions provided in Equations (1) through (5), with $$M = \begin{pmatrix} \tau^2 & \tau^3 & \tau^4 \\ 2\tau & 3\tau^2 & 4\tau^3 \\ \frac{\tau^3}{3} & \frac{\tau^4}{4} & \frac{\tau^5}{5} \end{pmatrix} \quad (8)$$

The spline function is thus defined by the above conditions.

This example shows that an optimized, smooth curve shape of the gradient pulse progressions in the different directions can be calculated very quickly and simply with a spline interpolation method via the provided boundary conditions.

The pulse shape to conclude the optimization within the optimized region or, respectively, in the optimized time interval can be can advantageously be further checked for the compliance with defined system specification parameters, independent of how the optimization takes place. For example, such system specification parameters can be a maximum allowable gradient amplitude for the respective magnetic resonance system and/or a maximum allowable slew rate.

If the system specification parameters are not complied with for whatever reasons—for example if the maximum allowable gradient amplitude and/or the maximum allowable slew rate is exceeded—the optimized pulse shape can thus not be used. In this case, the pulse shape in the time interval is advantageously replaced with the original pulse shape again.

As described above, quieter pulse sequences are thus generated in a very simple manner via the procedure according to the invention, and the linearity deviation of the gradients and the requirement for the hardware of the magnetic resonance system are decreased. In particular, unnecessary gradient activities—most of all event block boundaries—are prevented.

BRIEF DESCRIPTION OF THE DRAWINGS

FIG. 7 shows a portion of a pulse sequence as in FIG. 6, but with a pulse optimized by means of a spline interpolation method under defined additional boundary conditions.

DESCRIPTION OF THE PREFERRED EMBODIMENTS

Figure 1:
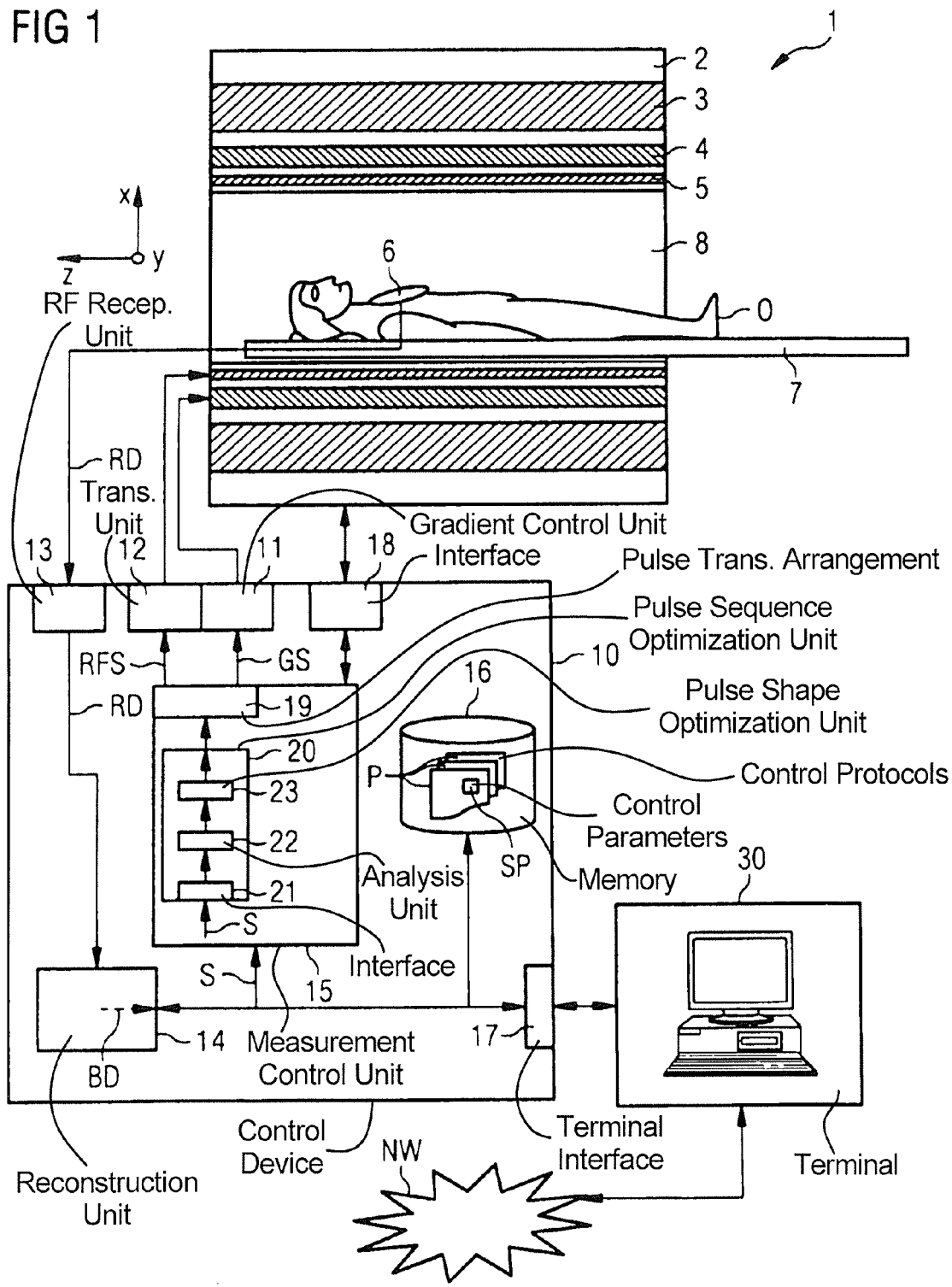
FIG. 1 schematically illustrates an exemplary embodiment of a magnetic resonance system according to the invention.

A magnetic resonance system 1 according to the invention is schematically depicted in FIG. 1. The actual magnetic resonance scanner 2 has an examination space 8 or patient tunnel 8 located therein. A bed 7 can be driven into this patient tunnel 8 so that a patient O or test subject lying thereupon during an examination can be supported at a defined position within the magnetic resonance scanner 2 relative to the magnet system and radio-frequency system arranged therein, can also be moved between different positions during a measurement.

Significant components of the magnetic resonance scanner 2 are a basic field magnet 3, a gradient system 4 with magnetic field gradient coils to generate magnetic field gradients in the x-, y- and z-directions, and a whole-body radio-frequency coil 5. The magnetic field gradient coils in the x-, y- and z-directions are controllable independently of one another so that gradients can be applied in arbitrary logical spatial directions (for example in the slice selection direction, in the phase coding direction or in the readout direction) by a predetermined combination. These directions normally depend on the selected slice orientation. The logical spatial directions can likewise also coincide with the x-, y- and z-directions, for example slice selection direction in the z-direction, phase coding direction in the y-direction and readout direction in the x-direction. The reception of magnetic resonance signals induced in the examination subject O can take place via the whole-body coil 5 with which the radio-frequency signals for induction of the magnetic resonance signals are normally also emitted. However, these signals are typically received with a local coil arrangement 6 with local coils (of which only one is shown here) placed on or below the patient O. All of these components are known in principle to the man skilled in the art and therefore are only roughly schematically shown in FIG. 1.

The components of the magnetic resonance scanner 2 are controllable by a control device 10. This can be a control computer which can include a number of individual computers (that may be spatially separated and connected among one another by suitable cables or the like). Via a terminal interface 17, this control device 10 is connected with a terminal 30 via which an operator can control the entire system 1. In the present case, this terminal 30 is equipped as a computer with keyboard; one or more monitors; and additional input devices (for example mouse or the like), such that a graphical user interface is provided to the operator.

Among other things, the control device 10 has a gradient control unit 11 that can in turn comprise multiple subcomponents. The individual gradient coils are supplied via this gradient control unit 11 with control signals according to a gradient pulse sequence GS. As described above, these are gradient pulses that are placed (executed) at precisely provided time positions and with a precisely predetermined chronological progression during a measurement.

Moreover, the control device 10 has a radio-frequency transmission unit 12 in order to feed respective radio-frequency pulses into the whole-body radio-frequency coil 5 according to a predetermined radio-frequency pulse sequence RFS of the pulse sequence MS. The radio-frequency pulse sequence RFS includes the aforementioned excitation and refocusing pulses. The reception of the magnetic resonance signals then occurs with the use of the local coil arrangement 6, and the raw data RD received from this are read out and processed by an RF reception unit 13. The magnetic resonance signals are passed in digital form as raw data RD to a reconstruction unit 14 that reconstructs the image data BD from these and stores these in a memory 16 and/or passes them to the terminal 30 via the interface 17 so that the operator can view them. The image data BD can also be stored at different locations via a network NW and/or be displayed and evaluated. Alternatively, a radio-frequency pulse sequence can be emitted via the local coil arrangement and/or the magnetic resonance signals can be received by the whole-body radio-frequency coil (not shown), depending on the current interconnection of the whole-body radio-frequency coil 5 and the coil arrangements 6 with the radio-frequency transmission unit 12 or, respectively, RF reception unit 13.

Via an additional interface 18, control commands are transmitted to other components of the magnetic resonance scanner 2 (for example the bed 7 or the basic field magnet 3) or measurement values or, respectively, other information are adopted.

The gradient control unit 11, the RF transmission unit 12 and the RF reception unit 13 are respectively controlled in coordination by a measurement control unit 15. Via corresponding commands, this ensures that the desired gradient pulse sequences GS and radio-frequency pulse sequences RFS are emitted. Moreover, it must be ensured that the magnetic resonance signals at the local coils of the local coil arrangement 6 are read out and processed further by the RF reception unit 13 at the matching point in time. The measurement control unit 15 likewise controls the interface 18. For example, the measurement control unit 15 can be formed from a processor or multiple interacting processors. A pulse sequence optimization device 20 can be implemented at this, for example in the form of suitable software components, which is explained in more detail later.

However, the fundamental workflow of such a magnetic resonance measurement and the cited components for control (apart from the pulse sequence optimization device 20) are known to those skilled in the art, such that here they do not need to be further addressed in detail. Moreover, such a magnetic resonance scanner 2 as well as the associated control device can still have a number of additional components that here are likewise not explained in detail. The magnetic resonance scanner 2 can be of a different design, for example with a laterally open patient space, or can be designed as a smaller scanner in which only one body part can be positioned.

In order to start a measurement, via the terminal 30 an operator can typically select a control protocol P provided for this measurement from a memory 16 in which are stored a plurality of control protocols P for different measurements. This control protocol P includes, among other things, various control parameters SP for the respective measurement. Counting among these control parameters SP are defined basic specifications for the desired pulse sequence, for example the sequence type (i.e. whether it is a spin echo sequence, a turbo spin echo sequence etc.). Furthermore counting among these are control parameters with regard to the magnetizations to be achieved via the individual radio-frequency pulses; specifications about a k-space gradient trajectory to be taken to acquire raw data; and moreover slice thicknesses, slice intervals, number of slices, resolution, repetition times, the echo times in a spin echo sequence etc.

With the use of the terminal 30, the operator can modify a portion of these control parameters in order to create an individual control protocol for a current desired measurement. For example, for this modifiable control parameters are offered for modification at a graphical user interface of the terminal 30.

Moreover, the operator can also retrieve control protocols via a network NW (for example from a manufacturer of the magnetic resonance system) and modify and use these as necessary.

Based on the control parameters SP, a pulse sequence S or measurement sequence is then determined with which the actual control of the remaining components finally takes place via the measurement control unit 15. The pulse sequence can be calculated in a pulse sequence determination device that, for example, can be realized in the form of software components at the computer of the terminal 30. In principle, however, the pulse sequence determination device can also be part of the control device 10 itself, in particular of the measurement control unit 15. However, the pulse sequence determination device could also be realized in a separate computer system which is connected with the magnetic resonance system via the network NW, for example.

Upon execution of a pulse sequence S, this is initially optimized in a pulse sequence optimization device 20 in the manner according to the invention by the measurement control unit 15 before it is supplied via a pulse transmission arrangement 19 of the measurement control unit 15, which ultimately passes the radio-frequency pulse sequence RS to the RF transmission unit 12 and the gradient pulse sequence GS to the gradient control unit 11. For this this pulse sequence optimization device 20 includes an input interface 21 in order to accept the actual pulse sequence S—that is finished and emission-ready but is to be optimized—and pass it to an analysis unit 22 which implements the analysis of the pulse sequence to identify fixed point time periods and modifiable time intervals that might be optimized. In a pulse shape optimization device 23, the pulse shape of gradient pulses in the modifiable time intervals is then optimized with regard to the predetermined optimization criterion (the first derivative, for example). Insofar as a different optimization criterion should be used instead of or in addition to the aforementioned optimization of the first derivative with regard to a noise reduction, this can be predetermined by an operator via the terminal 30, for example. For example, various optimization criteria and the associated rules can be stored in a memory, and these optimization criteria are offered for selection to the operator on a monitor of the terminal 30, which operator then makes the selection via a graphical user interface or, respectively, corresponding selection commands are registered via a user interface.

The precise functionality of these components is presented in the following using FIGS. 2 through 5 in the example of a generation and additional processing of a pulse sequence S up to the point at which they are output (emission of the radio-frequency pulses and application of the gradients, as well as unlocking the reception devices) by the pulse transmission arrangement 19. An optimization of the 1st derivative of the gradient pulses is thereby assumed again as an example with regard to a noise reduction.

Figure 2:
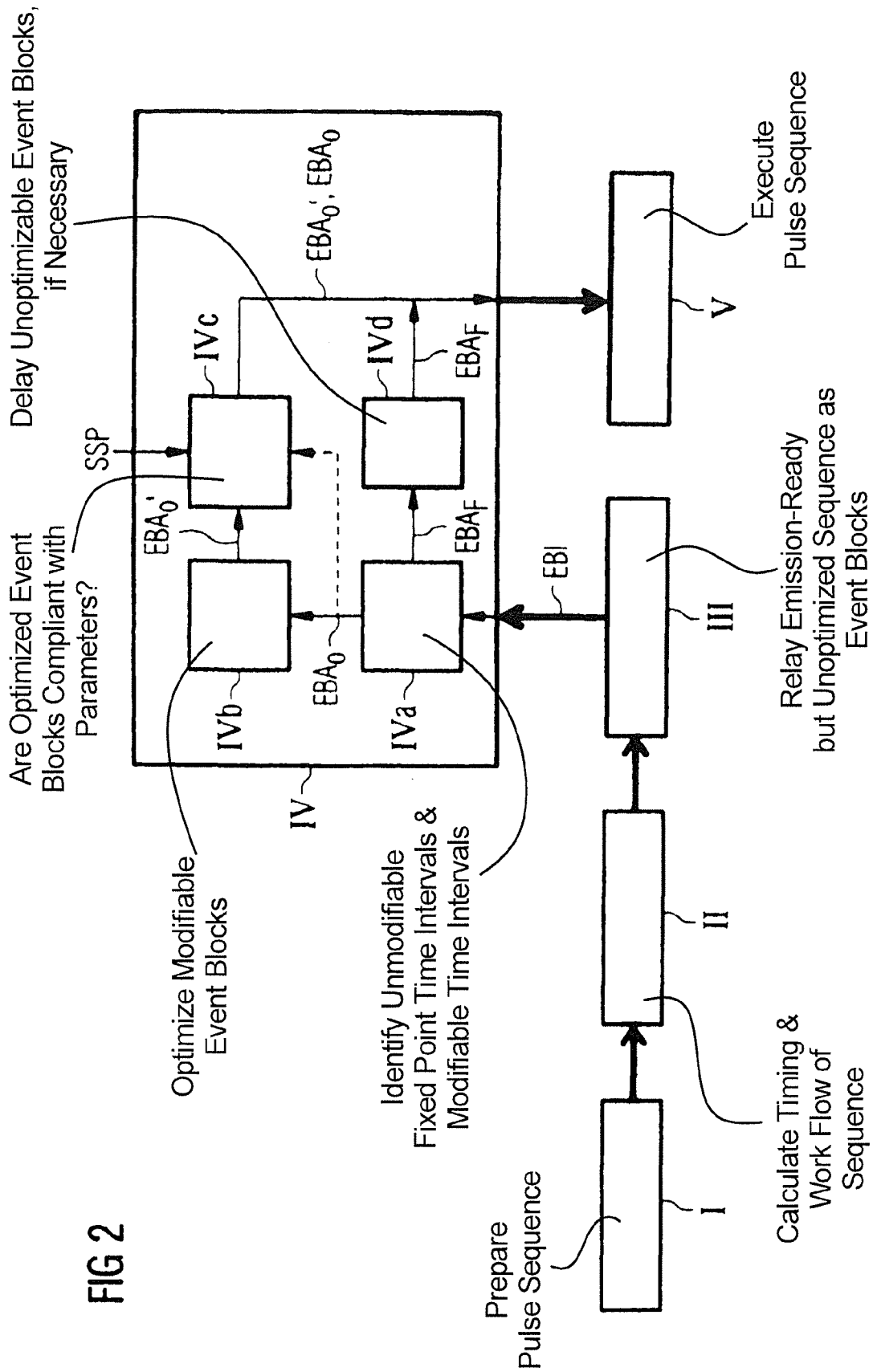
FIG. 2 schematically shows a workflow plan of an exemplary embodiment of the method according to the invention.

As is depicted in FIG. 2, the method initially begins in Step I in a typical manner with the preparation of the pulse sequence S. This means that (among other things) the sequence type is established or, respectively, a corresponding protocol is sought in which a defined sequence type is defined. The adoption of the required parameters or, respectively, possibly also modifications of these parameters by the user thereby takes place. In Step II, the precise timing and the workflow of the pulse sequence with the predetermined defined sequence parameters are then calculated. The relaying of the emission-ready pulse sequence that still has not been optimized takes place in Step III in the form of event blocks. A direct relaying of the event blocks to the pulse transmission arrangement 19 could take place in Step III without application of the method according to the invention, which pulse transmission arrangement 19 then executes the event blocks in Step V and ensures that the entire pulse sequence S is executed. However, according to the invention a processing of the individual event blocks takes place in Step IV before the relaying of said event blocks. Since the execution of the pulse sequence S in Steps II, III, IV and V takes place sequentially in the form of individual event blocks, these steps can accordingly take place in parallel temporally, meaning that later event blocks are still located in Step II while earlier event blocks are already passed to the pulse transmission arrangement 19 in Step V.

Figure 3:
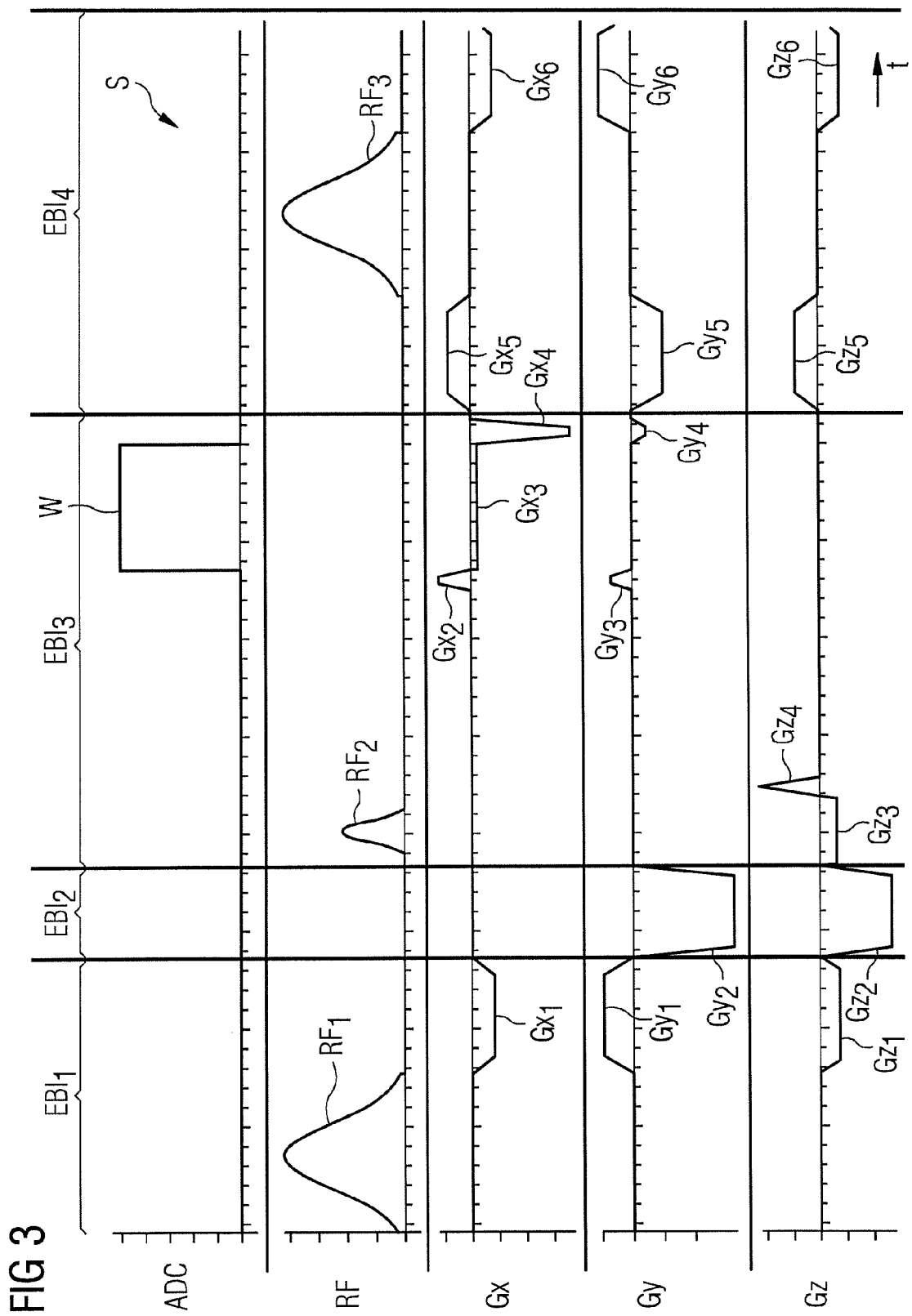
FIG. 3 is an example pulse sequence to which the method according to the invention can be applied, subdivided into arriving event blocks.

A pulse diagram of the first part of a very simplified gradient echo sequence is depicted in FIG. 3, which gradient echo sequence is subdivided into event blocks $EBI_1$, $EBI_2$, $EBI_3$, $EBI_4$ (in FIG. 3 only the first three event blocks are completely shown, and the fourth event block is nearly completely shown). In this pulse diagram the readout window W, the radio-frequency pulses $RF_1$, $RF_2$, $RF_3$ to be emitted and the gradient pulses are respectively shown depending on the time t in the typical manner on different overlapping time axes. The readout window W is thereby shown on the uppermost readout time axis ADC and the amplitudes of the radio-frequency pulses $RF_1$, $RF_2$, $RF_3$ to be emitted are shown on the second uppermost radio-frequency pulse time axis RF. The gradient pulses $Gx_1$, $Gx_2$, $Gx_3$, $Gx_4$, $Gx_5$, $Gx_6$ are shown in the gradient pulse time axis Gx situated therebelow. These are the gradient pulses in the readout direction. The gradient pulses $Gy_1$, $Gy_2$, $Gy_3$, $Gy_4$, $Gy_5$, $Gy_6$ which are switched in the phase coding direction are shown on the second lowermost gradient pulse time axis Gy, and the gradient pulses $Gz_1$, $Gz_2$, $Gz_3$, $Gz_4$, $Gz_5$, $Gz_6$ in the slice selection direction are shown on the lowermost gradient pulse time axis Gz. The position of the time axis respectively indicates the zero line, meaning that the pulses can be negative or positive gradient pulses in the gradients depending on whether their amplitudes extend downward or upward from the gradient pulse time axis Gx, Gy, Gz. For simplification, in all pulse diagrams the scaling in the time direction and in the amplitude direction takes place only in arbitrary units, since primarily only the comparison of the pulse curves or, respectively, shapes before and after the optimization is relevant to the understanding of the inventive principle.

The first event block $EBI_1$ of this pulse sequence S is an event block $EBI_1$ which should cause a fat saturation. A relatively strong radio-frequency pulse $RF_1$ is therefore initially emitted during which no gradient pulse is executed, such that the radio-frequency pulse $RF_1$ does not act in a slice-selective manner. However, three gradient pulses $Gx_1$, $Gy_1$, $Gz_1$ immediately follow in all three spatial axes after the end of this radio-frequency pulse $RF_1$, which three gradient pulses serve to dephase unwanted transversal magnetization generated by the fat saturation.

The next event block $EBI_2$ serves as a pre-spoiler. In this event block $EBI_2$, two negative gradient pulses $Gy_2$, $Gz_2$ are switched in the y- and z-directions. These pulses also serve to effectively dephase transversal residual magnetization that is possibly present that could have been generated or, respectively, refocused by preceding excitations or gradients.

The third event block $EBI_3$ includes a gradient echo sequence in which magnetic resonance signals are acquired in a defined volume or a defined slice, in that the volume is excited by a radio-frequency pulse $RF_2$ with simultaneous execution of a defined gradient $Gz_3$ in the slice selection direction Gz, and subsequently a readout window W is then placed while switching a defined gradient $Gx_3$ in the readout direction Gx (meaning that the ADC is switched to receive). There are additional gradient pulses $Gz_4$, $Gx_2$, $Gy_3$, $Gx_4$, $Gy_4$ in this event block $EBI_3$ which serve to dephase transversal magnetization generated by the excitation pulse in order to not generate unwanted echoes in the following event blocks.

An additional fat saturation event block $EBI_4$ follows this gradient echo event block $EBI_3$, which additional fat saturation event block $EBI_4$ initially begins in that three gradient pulses $Gx_5$, $Gy_5$, $Gz_5$ are switched in parallel in the x-, y- and z-direction; then a non-slice-selective radio-frequency pulse $RF_3$ is emitted, wherein all gradients are set to zero; and subsequently additional gradient pulses $Gx_6$, $Gy_6$, $Gz_6$ are emitted again in all three spatial directions. Additional event blocks can subsequently follow, for example a new pre-spoiler, an additional repetition, a gradient echo event block etc.

As is easily recognizable, each of these event blocks $EBI_1$, $EBI_2$, $EBI_3$, $EBI_4$ includes time periods that would be optimizable in principle. Here these are the time periods that do not fall under the criteria described above, for example gradients that are emitted in parallel with one of the radio-frequency pulses $RF_1$, $RF_2$, $RF_3$ or the readout window W. Specific gradient pulses that are predominantly unmodifiable—such as flow compensation gradient pulses, fusion gradient pulses or knock gradient pulses—are not included in the simplified sequence presented here.

Apart from the pre-spoiler event block $EBI_2$ all other event blocks $EBI_1$, $EBI_2$, $EBI_4$ also include fixed point time periods in which no modification of the gradient amplitude values is allowed and that are thus are to be excluded from an optimization. As shown in FIG. 2, within the method step IV the incoming event blocks EBI are therefore initially checked in a first sub-step IVa as to where the unmodifiable fixed point time periods are situated and where the modifiable or, respectively, optimizable time intervals are situated.

A re-division of the pulse sequence S into outgoing event blocks $EBA_F$, $EBA_O$ also takes place in this Step IVa.

Figure 4:
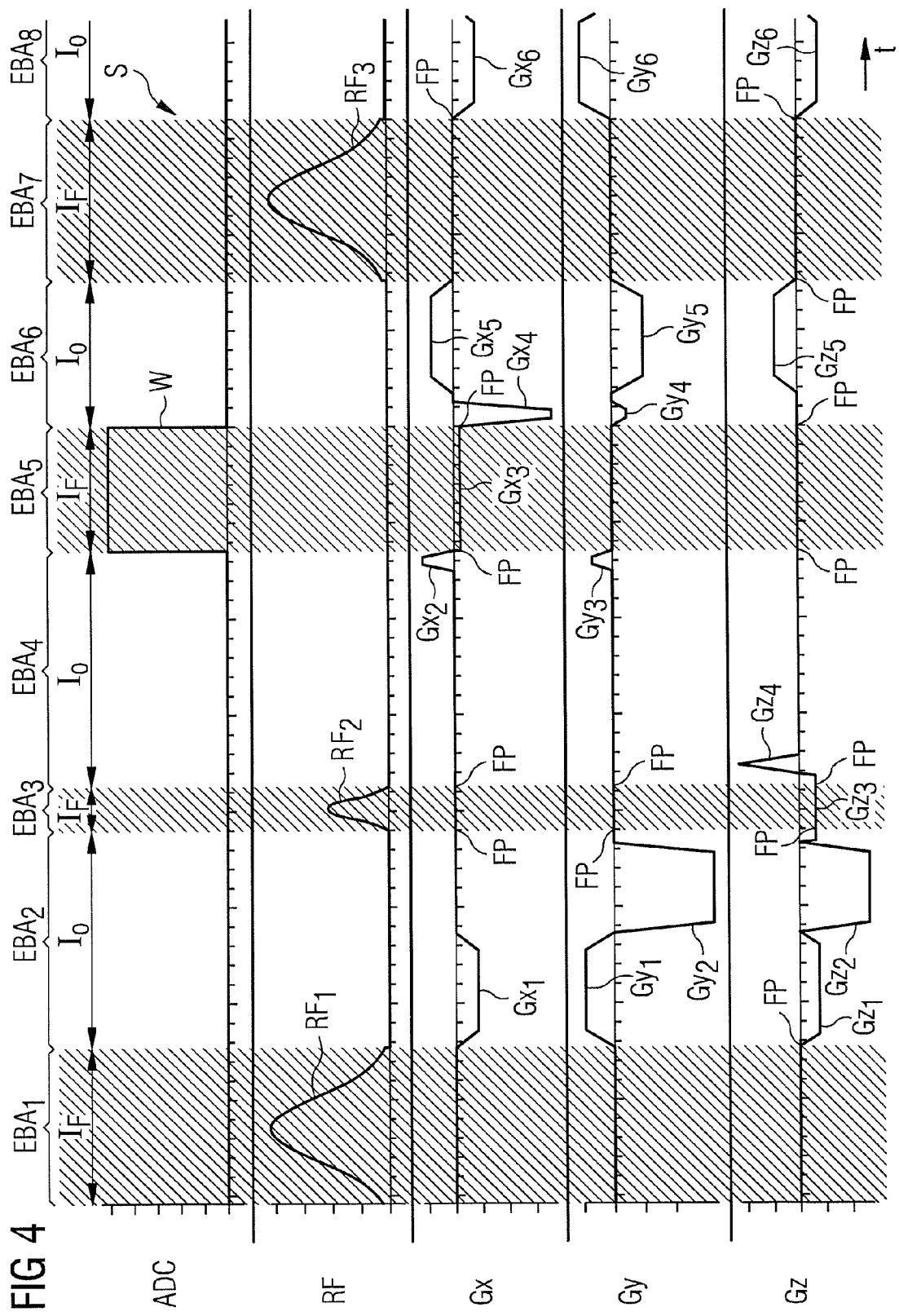
FIG. 4 shows the pulse sequence according to FIG. 3, subdivided into outgoing unmodifiable event blocks, which include a fixed point/time period and optimizable event blocks which include a modifiable time interval.

This is shown in FIG. 4 for the pulse sequence from FIG. 3. Here the non-optimizable fixed point time periods are respectively covered by a cross-striped pattern and the optimizable time intervals are not covered. New outgoing event blocks $EBA_1$, $EBA_2$, ..., $EBA_8$ thereby automatically result, wherein these outgoing event blocks $EBA_1$, $EBA_2$, ..., $EBA_8$ either include precisely one fixed point time period $I_F$ or an optimizable time interval $I_O$. Here the time periods in which the radio-frequency pulses $RF_1$, $RF_2$, $RF_3$ are emitted in parallel or the readout window W is switched have been precisely identified as non-optimizable time periods. In these periods, the gradients must remain at the exactly predetermined amplitude values. In the periods situated between these, the pulse shapes or, respectively, the gradient curve may be arbitrarily varied under the boundary conditions such that: the amplitude values are maintained at the boundary points to the adjoining event blocks that include the non-optimizable fixed point time periods $I_F$; the first derivative at these boundary points is zero; and the total moment of the gradient pulses in the respective optimizable time periods $I_O$ is the same before and after the optimization. The optimizable event blocks $EBA_2$, $EBA_4$, $EBA_6$, $EBA_8$ are then optimized in an additional Step IVb under the boundary conditions just named (in FIG. 2 these optimizable event blocks are globally designated by the reference character $EBA_O$).

The optimization then takes place using the spline interpolation method explained above, wherein the amplitude values at the boundaries are respectively considered to be fixed points FP and a spline leads, under the cited boundary conditions (reaching the fixed points, 1st derivative at the fixed points=0 and maintenance of the integral under the curve), to a desired smooth pulse shape in the respective optimizable time periods $I_O$.

Figure 5:
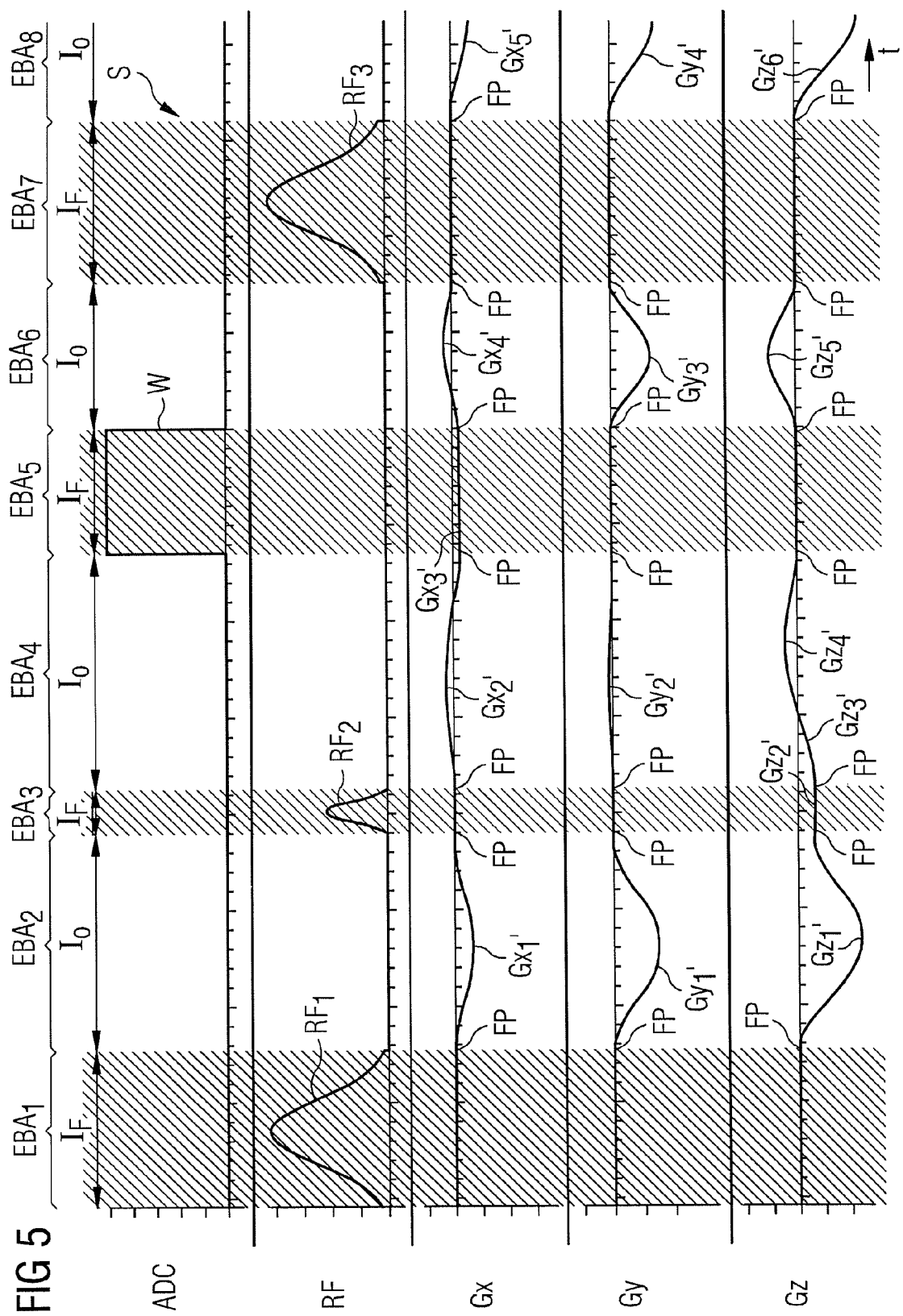
FIG. 5 shows the pulse sequence according to FIG. 4 after optimization of the optimizable event blocks.

This is presented in FIG. 5 for the pulse sequence according to FIG. 4. In particular, it is very advantageous that adjoining, relatively angular pulses with steep edges in gradient pulses $Gx_1'$, $Gx_2'$, $Gx_3'$, $Gx_4'$, $Gx_5'$, $Gy_1'$, $Gy_2'$, $Gy_3'$, $Gy_4'$, $Gz_1'$, $Gz_2'$, $Gz_3'$, $Gz_4'$, $Gz_5'$, $Gz_6'$ have been converted with common pulse shapes that in part cross over into one another, which pulse shapes are relatively smooth and therefore entail significantly lower loads for the gradient coils (and thus significantly reduce the noise exposure). As an example of this merging of gradient pulses, reference is made in particular to the merging of the gradient pulses $Gy_1$, $Gy_2$ in the original pulse sequence S according to FIGS. 3 and 4 into a common gradient pulse $Gy_{1'}$ in the optimized pulse sequence, as well as to the gradient pulses $Gz_1$ through $Gz_3$ that have now been replaced by a common pulse shape $Gz_{1'}$, $Gz_{2'}$, $Gz_{3'}$ that even extends beyond three event blocks $EBA_2$, $EBA_3$, $EBA_4$. In particular, here it is to be noted that the gradient amplitude has thereby not varied during the event block $EBA_3$ in which a slice-selective radio-frequency pulse $RF_2$ has been emitted in parallel, meaning that exactly in this period the original part of the pulse $Gz_3$ precisely corresponds to the gradient pulse $Gz_{2'}$ that is now present in the event block $EBA_3$.

From FIGS. 3 through 5 it can be seen how, before execution, each pulse sequence can be very quickly yet immediately optimized effectively with the method according to the invention with regard to the noise exposure and loading of the gradient coils without any modification of the timing being required, and consequently also with no changes of the image quality whatsoever.

Figure 6:
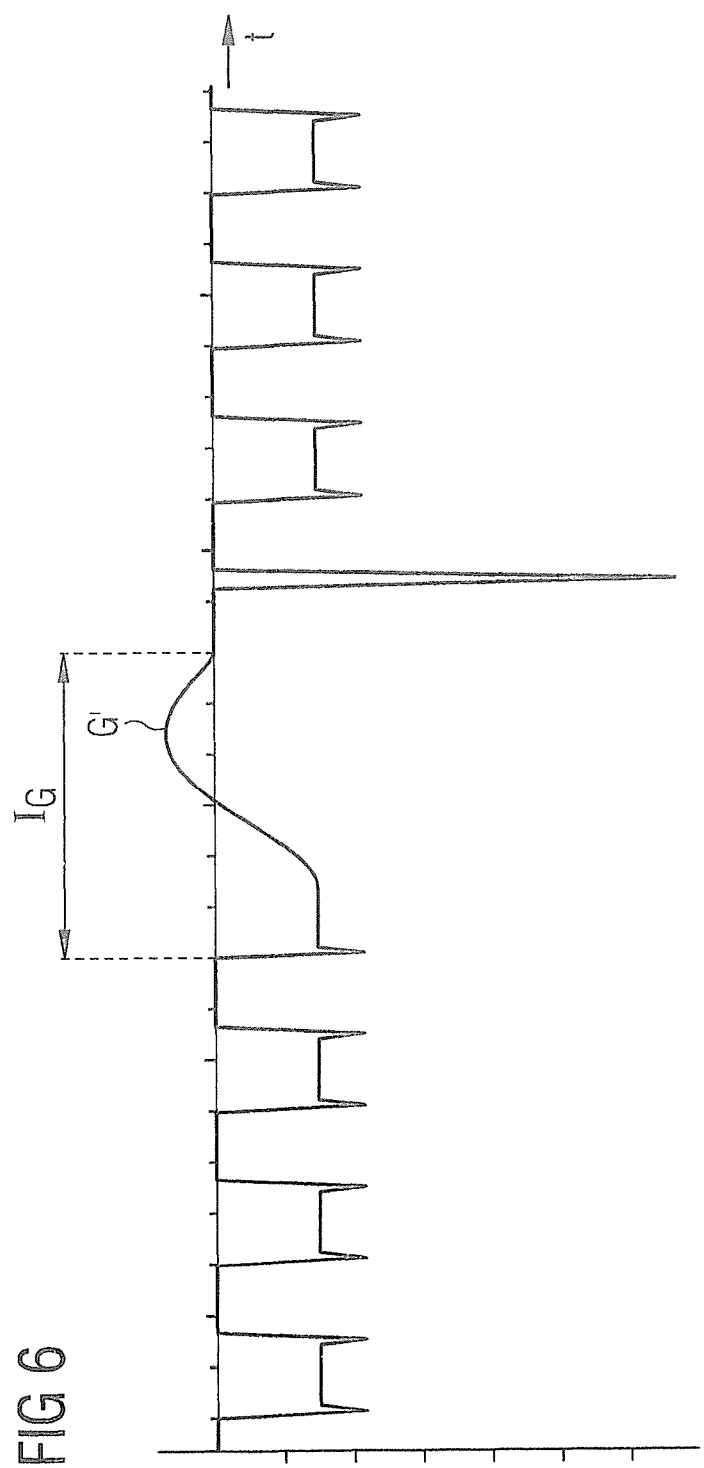
FIG. 6 shows a portion of a pulse sequence with a pulse optimized by a spline interpolation method.

Insofar as protocols with particularly long repetition times or particularly long pauses after pre-pulses or measurement intervals are used and additional gradient spoiler are applied, it can occur that the desired spoiling is prevented by the merging of the gradients over the complete time period of the pause. Such an extension of a spoiler pulse that unintentionally makes it too long is shown at a section of a gradient pulse sequence in FIG. 6. Here a gradient pulse G' is extended over a relatively wide interval I with a spline interpolation method in the manner according to the invention. In order to be able to completely preclude such rare effects, an additional boundary condition can simply be provided according to which the mean value of the moment over the time interval $I_G$ is checked, and if this falls below a defined value the total interval $I_G$ is simply divided into two sub-intervals $I_1$, $I_2$ as this is shown in FIG. 7. One of the sub-intervals (the sub-interval $I_2$ in FIG. 7) is then set to a gradient amplitude of zero and the optimization then runs only over the other sub-interval $I_1$. This also leads to a gradient pulse G" with a pulse shape with a less edge steepness that is improved relative to the pulse before the optimization, but at the same time it is ensured that the total moment per time unit in this interval is still high enough in order to achieve the spoiler effect.

In an additional Step IVc, the optimized event blocks $EBA_O'$ can then be checked further as to whether they comply with defined system-specific parameters SSP, for example whether they are below a maximum permissible gradient amplitude for the respective magnetic resonance system and whether the maximum permissible slew rate is complied with. If this is not the case, the optimized event block $EBA_O'$ is replaced again by the original event block $EBA_O$, as is indicated here by the dashed line. However, it is typically to be assumed that the optimized event blocks $EBA_O'$ comply with these conditions. The system-specific parameters SSP can be stored in a memory, for example. In Step V the optimized event block $EBA_O'$ (or, in the individual case, the unoptimized event block $EBA_O'$) is then passed to the pulse transmission arrangement 19 and executed, wherein the pulse transmission arrangement ensures that the unoptimizable event blocks $EBA_F$ are also executed in the matching order. For this, the individual optimized $EBA_O'$ or, respectively, optimizable $EBA_O$ and the unoptimizable event blocks $EBA_F$ are passed to the pulse transmission arrangement 19 in the matching chronological order. For example, the unoptimizable event blocks $EBA_F$ can thereby be delayed in a delay Step IVd so that they are only passed at the matching point in time.

Step IVa can also be explained so that the pulse sequence S is initially subdivided into two different categories in its time curve, i.e. into optimizable event blocks and unoptimizable event blocks. For example, if a radio-frequency pulse or a readout window is applied, the associated time interval is associated with category 0="unoptimizable"; in contrast to this, the intervening intervals of the pulse sequence S without such radio-frequency pulses or readout windows are associated with the category 1="optimizable", Time intervals (the optimizable and unoptimizable event blocks) [0, $t_1$], [$t_1$, $t_2$], [$t_2$, $t_3$] etc. are then created with alternating categories 0 and 1. The time intervals of category 1 are then subsequently optimized in the cited manner, for example by means of the spline interpolation method. The calculated spline curve then replaces the original curve of all pulses in this interval, such that the moment of the gradient curve (and therefore the influence on the spin phase) is constant and at the same time the curve remains continuously differentiable.

Although modifications and changes may be suggested by those skilled in the art, it is the intention of the inventors to embody within the patent warranted hereon all changes and modifications as reasonably and properly come within the scope of their contribution to the art.

We claim as our invention:

1. A method to optimize a pulse sequence for a magnetic resonance system, comprising:

providing a magnetic resonance pulse sequence to a processor, via an input of the processor, said magnetic resonance pulse sequence, at a time at which the magnetic pulse sequence is provided to said processor, already being in a form that is executable by a magnetic resonance system, said magnetic resonance pulse sequence comprising a plurality of radio-frequency (RF) pulses and a plurality of gradient pulses chronologically coordinated with the plurality of RF pulses with each of said gradient pulses having a gradient amplitude that is set to a current value by said magnetic resonance pulse sequence;

in said processor, analyzing said magnetic resonance pulse sequence to identify fixed sequence characteristics therein, selected from the group consisting of individual points in time and time intervals, at which said current value of said gradient amplitude is not to be modified, and further time intervals therein in which said current value of said gradient amplitude may be modified;

in said processor, optimizing the gradient pulses in at least one of said further time intervals according to a predetermined optimization criterion, while maintaining a length of said at least one of said further time intervals unchanged, while leaving said gradient pulses at said fixed sequence characteristics unmodified, thereby producing an optimized magnetic resonance pulse sequence; and making said optimized pulse sequence available at an output of said processor as electrical signals in a format configured to operate a magnetic resonance system with said optimized pulse sequence.

2. A method as claimed in claim 1 comprising optimizing said gradient pulses by optimizing a first derivative of a pulse shape of the respective gradient pulses in said at least one of said further time intervals.

3. A method as claimed in claim 1 comprising providing, as said magnetic resonance pulse sequence, a magnetic resonance pulse sequence comprising chronologically successive event blocks, and, in said processor, analyzing each of said event blocks as that respective event block arrives in the processor in order to identify said fixed sequence characteristics and said further time intervals in the respective event block, and re-organizing said magnetic resonance pulse sequence, with a different sub-division thereof into outgoing event blocks, in said optimized magnetic resonance pulse sequence.

4. A method as claimed in claim 3 comprising identifying a time period within said magnetic resonance pulse sequence as a fixed sequence characteristic when, in said magnetic resonance pulse sequence, at least one event should occur in the respective time period, within the group of events consisting of readout of an RF pulse, readout of raw data, activating a flow compensation gradient pulse, activating a diffusion gradient pulse, and activating a knock gradient pulse.

5. A method as claimed in claim 1 comprising identifying a time period within said magnetic resonance pulse sequence as a fixed sequence characteristic or as a further time interval according to an analysis selected from the group consisting of analysis of respective transmission times of respective RF pulses, analysis of readout times of magnetic resonance data, analysis of respective shapes of the gradient pulses, and analysis of identifiers included in an event block parameter set when said magnetic resonance pulse sequence is comprised of a plurality of chronologically successive event blocks.

6. A method as claimed in claim 1 comprising optimizing said magnetic resonance pulse sequence by optimizing a pulse shape of respective gradient pulses by at least one of maintaining a moment of the respective gradient pulse constant, and maintaining a gradient amplitude at defined fixed points-in-time constant, said fixed points-in-time including boundary values at interval boundaries of the at least one of said further time intervals with an adjoining fixed sequence characteristic.

7. A method as claimed in claim 1 comprising optimizing said magnetic resonance pulse sequence by merging adjoining gradient pulses into a common gradient pulse.

8. A method as claimed in claim 1 comprising optimizing said magnetic resonance pulse sequence by determining, in said processor, whether an entire moment per time unit of the respective gradient pulses in a selected direction is below a predetermined value within a time interval and, if so, subdividing the time interval in to multiple sub-intervals and optimizing the pulse shape of the gradient pulse in each sub-interval to cause gradient pulses in said direction to occur in only some of said sub-intervals.

9. A method as claimed in claim 8 comprising implementing a spline interpolation procedure to optimize said pulse shape.

10. A method as claimed in claim 9 comprising implementing said spline interpolation procedure as a spline interpolation procedure of the fourth order.

11. A method as claimed in claim 1 comprising optimizing said magnetic resonance pulse sequence by optimizing a pulse shape of respective gradient pulses in said at least one of said further time intervals and, in said processor, determining whether the optimized pulse shape complies with system specification parameters representing at least one of a maximum allowable gradient amplitude and a maximum allowable slew rate.

12. A method as claimed in claim 11 comprising replacing the pulse shape of the respective gradient pulse in the at least one of said further time intervals with an original pulse shape of the respective gradient in the magnetic resonance pulse sequence supplied to the processor, if the optimized pulse shape does not comply with said system specification parameters.

13. A method for operating a magnetic resonance system comprising:

providing a magnetic resonance pulse sequence to a processor, via an input of the processor, said magnetic resonance pulse sequence, at a time at which the magnetic pulse sequence is provided to said processor, already being in a form that is executable by a magnetic resonance system, said magnetic resonance pulse sequence comprising a plurality of radio-frequency (RF) pulses and a plurality of gradient pulses chronologically coordinated with the plurality of RF pulses with each of said gradient pulses having a gradient amplitude that is set to a current value by said magnetic resonance pulse sequence;

in said processor, analyzing said magnetic resonance pulse sequence to identify fixed sequence characteristics therein, selected from the group consisting of individual points in time and time intervals, at which said current value of said gradient amplitude is not to be modified, and further time intervals therein in which said current value of said gradient amplitude may be modified;

in said processor, optimizing the gradient pulses in at least one of said further time intervals according to a predetermined optimization criterion, while maintaining a length of said at least one of said further time intervals unchanged, while leaving said gradient pulses at said fixed sequence characteristics unmodified, thereby producing an optimized magnetic resonance pulse sequence;

emitting said optimized pulse sequence from an output of said processor as electrical signals in a format configured to operate a magnetic resonance system with said optimized pulse sequence; and operating said magnetic resonance system according to said optimized magnetic resonance pulse sequence.

14. A pulse optimization device comprising:

a processor having an input supplied with a magnetic resonance pulse sequence, said magnetic resonance pulse sequence, at a time at which the magnetic pulse sequence is provided to said processor, already being in a form that is executable by a magnetic resonance system, said magnetic resonance pulse sequence comprising a plurality of radio-frequency (RF) pulses and a plurality of gradient pulses chronologically coordinated with the plurality of RF pulses with each of said gradient pulses having a gradient amplitude that is set to a current value by said magnetic resonance pulse sequence;

said processor being configured to analyze said magnetic resonance pulse sequence to identify fixed sequence characteristic therein, selected from the group consisting of individual points in time and time intervals, at which said current value of said gradient amplitude is not to be modified, and further time intervals therein in which said current value of said gradient amplitude may be modified;

said processor being configured to optimize the gradient pulses in at least one of said further time intervals according to a predetermined optimization criterion, while maintaining a length of at least one of said time intervals unchanged, while leaving said gradient pulses at said fixed sequence characteristics unmodified, thereby producing an optimized magnetic resonance pulse sequence; and said processor being configured to make said optimized pulse sequence available at an output of said processor as electrical signals in a format configured to operate a magnetic resonance system with said optimized pulse sequence.

15. A magnetic resonance system comprising:

a magnetic resonance data acquisition unit comprising a radio-frequency (RF) transmission system and a gradient system;

a processor;

said processor having an input supplied with a magnetic resonance pulse sequence, said magnetic resonance pulse sequence, at a time at which the magnetic pulse sequence is provided to said processor, already being in a form that is executable by a magnetic resonance system, said magnetic resonance pulse sequence comprising a plurality of radio-frequency (RF) pulses and a plurality of gradient pulses chronologically coordinated with the plurality of RF pulses with each of said gradient pulses having a gradient amplitude that is set to a current value by said magnetic resonance pulse sequence;

said processor being configured to analyze said magnetic resonance pulse sequence to identify fixed sequence characteristic therein, selected from the group consisting of individual points in time and time intervals, at which said current value of said gradient amplitude is not to be modified, and further time intervals therein in which said current value of said gradient amplitude may be modified;

said processor being configured to optimize the gradient pulses in at least one of said further time intervals according to a predetermined optimization criterion, while maintaining a length of at least one of said time intervals unchanged, while leaving said gradient pulses at said fixed sequence characteristics unmodified, thereby producing an optimized magnetic resonance pulse sequence; and said processor being configured to operate said magnetic resonance data acquisition unit to radiate RF pulses with said RF transmission system and to activate gradient pulses with said gradient system according to said optimized pulse sequence.

16. A non-transitory, computer-readable data storage medium encoded with programming instructions, said data storage medium being loaded into a computerized processing and control system of a magnetic resonance apparatus that also comprises a magnetic resonance data acquisition unit, said programming instructions causing said computerized control and processing system to:

receive a magnetic resonance pulse sequence via an input of the control and processing system, said magnetic resonance pulse sequence, at a time at which the magnetic pulse sequence is provided to said processor, already being in a form that is executable by a magnetic resonance system, said magnetic resonance pulse sequence comprising a plurality of radio-frequency (RF) pulses and a plurality of gradient pulses chronologically coordinated with the plurality of RF pulses with each of said gradient pulses having a gradient amplitude that is set to a current value by said magnetic resonance pulse sequence;

analyze said magnetic resonance pulse sequence to identify fixed sequence characteristics therein, selected from the group consisting of individual points in time and time intervals at which said current value of said gradient amplitude is not to be modified, and further time intervals therein in which said current value of said gradient amplitude may be modified;

optimize the gradient pulses in at least one of said further time intervals according to a predetermined optimization criterion, while maintaining a length of said at least one of said further time intervals unchanged, while leaving said gradient pulses at said fixed sequence characteristics unmodified, thereby producing an optimized magnetic resonance pulse sequence; and make said optimized pulse sequence available at an output of said control and processing system as electrical signals in a format configured to operate a magnetic resonance system with said optimized pulse sequence.

* * * * *